(12) United States Patent
Lu et al.

(10) Patent No.: US 8,015,475 B2
(45) Date of Patent: Sep. 6, 2011

(54) ERASURE DECODING FOR RECEIVERS

(75) Inventors: Jin Lu, Fremont, CA (US); Po Tong, Los Altos, CA (US); Chia-Ning Peng, Fremont, CA (US)

(73) Assignee: Texas Instruments Incorporated, Dallas, TX (US)

( * ) Notice: Subject to any disclaimer, the term of this patent is extended or adjusted under 35 U.S.C. 154(b) by 1075 days.

(21) Appl. No.: 11/828,726

(22) Filed: Jul. 26, 2007

(65) Prior Publication Data

US 2009/0031197 A1 Jan. 29, 2009

(51) Int. Cl.
*H03M 13/00* (2006.01)
(52) U.S. Cl. ......... 714/784; 714/761; 714/774; 714/804
(58) Field of Classification Search .................. 714/761, 714/774, 804, 784
See application file for complete search history.

(56) References Cited

U.S. PATENT DOCUMENTS

| | | | | |
|---|---|---|---|---|
| 4,764,927 | A | * | 8/1988 | Izumita et al. ................. 714/761 |
| 5,206,864 | A | * | 4/1993 | McConnell .................... 714/755 |
| 6,511,280 | B1 | | 1/2003 | Sammartino et al. |
| 6,647,070 | B1 | | 11/2003 | Shalvi et al. |
| 6,920,194 | B2 | | 7/2005 | Stopler et al. |
| 2008/0232444 | A1 | * | 9/2008 | Tzannes ........................ 375/219 |

FOREIGN PATENT DOCUMENTS

| | | |
|---|---|---|
| WO | 2005107421 A2 | 11/2005 |
| WO | 2006044742 A1 | 4/2006 |
| WO | 2006129144 A1 | 12/2006 |

* cited by examiner

*Primary Examiner* — Sam Rizk
(74) *Attorney, Agent, or Firm* — Steven A. Shaw; W. James Brady; Frederick J. Telecky, Jr.

(57) ABSTRACT

A system comprising communication logic capable of receiving data signals from a network. The signals comprise both erasure error and random error. The system also comprises processing logic coupled to the communication logic and adapted to partition parity check bytes of the received signals into a first portion and a second portion. The processing logic uses the first portion for random error correction and the second portion for erasure error correction.

19 Claims, 3 Drawing Sheets

ERASURE DECODING FOR RECEIVERS

BACKGROUND

Receivers in communication systems, such as Digital Subscriber Line (DSL) systems, apply error-correction techniques to received signals in order to remove erroneous data that may have been added to the signals during transmission. In general, there are two types of errors: those whose locations and values are unknown (random errors) and those whose locations are known but values are unknown (erasure errors). Error correction techniques may be used to correct random errors or erasure errors. However, in signals containing both random errors and erasure errors, increasing the degree of error correction for one type of error generally results in decreased error correction for the other type of error.

SUMMARY

Accordingly, these are disclosed herein techniques for correction of both random errors and erasure errors which mitigate error correction degradation. An illustrative embodiment includes a system comprising communication logic capable of receiving data signals from a network. The signals comprise both erasure error and random error. The system also comprises processing logic coupled to the communication logic and adapted to partition parity check bytes of the received signals into a first portion and a second portion. The processing logic performs random error correction using the first portion and erasure error correction using the second portion.

Another illustrative embodiment includes a method comprising determining a number of parity check bytes in a received codeword, where the codeword comprises both random errors and erasure errors. The method also comprises partitioning the number into a first portion and a second portion. The method also comprises determining the first portion by determining a code rate for random noise in the codeword. The method further comprises determining the second portion by determining a difference between the first portion and a number of parity check bytes. The method further comprises performing random error protection using the first portion and performing erasure error correction using the second portion.

Another illustrative embodiment includes a computer-readable medium comprising software code which, when executed by a processor, causes the processor to determine a number of parity check bytes in a received codeword, where the codeword comprises random errors and erasure errors. The processor also partitions the number into a first portion and a second portion. The processor determines the first portion by determining a code rate for random noise in the codeword. The processor determines the second portion by determining a difference between the first portion and a number of parity check bytes. The processor performs random error correction using the first portion and erasure error correction using the second portion.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to. . . . " Also, the term "couple" or "couples" is intended to mean either an indirect or direct electrical or wireless connection. Thus, if a first device couples to a second device, that connection may be through a direct electrical or wireless connection, or through an indirect electrical or wireless connection via other devices and connections. The term "connection" refers to any path via which a signal may pass. For example, the term "connection" includes, without limitation, wires, traces and other types of electrical conductors, optical devices, wireless pathways, etc. Further, the term "or" is meant to be interpreted in an inclusive sense rather than in an exclusive sense. The term "system" as used herein may refer to a computer, a modem, a communication device, a network, or a network comprising any of the foregoing. However, the scope of this disclosure is not limited to this definition of the term "system."

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
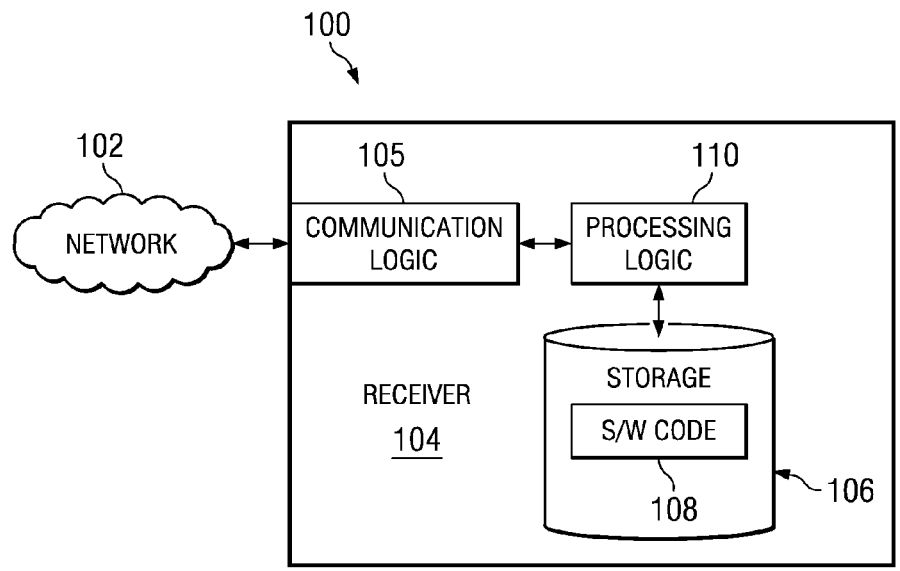
FIG. 1 shows a block diagram of an illustrative communication system implementing the technique disclosed herein, in accordance with various embodiments.

FIG. 1 shows an illustrative system 100 implementing the technique in accordance with embodiments of the invention. The system 100 comprises any suitable type of communication system, such as a DSL-based (e.g., asymmetric DSL (ADSL)) communication system. The system 100 comprises a network 102, such as the Internet, an intranet or some other suitable network infrastructure. The network 102 couples to a receiver 104, such as a DSL modem. Communications between the network 102 and the receiver 104 may be wired or wireless. The receiver 104 comprises communication logic 105 and processing logic 110. The communication logic 105 receives data signals from the network 102 and provides the data signals to the processing logic 110. The processing logic 110 couples to a storage 106. The storage 106 may comprise a processor (computer)-readable medium such as random access memory (RAM), volatile storage such as read-only memory (ROM), a hard drive, flash memory, etc. or combinations thereof. The storage 106 comprises software code 108. The processing logic 110 is capable of executing the software code 108. When executed, the software code 108 causes the processing logic 110 to implement the technique disclosed herein. In particular, execution of the software code 108 causes the processing logic 110 to implement one or more error correction techniques in accordance with embodiments of the invention.

Figure 2:
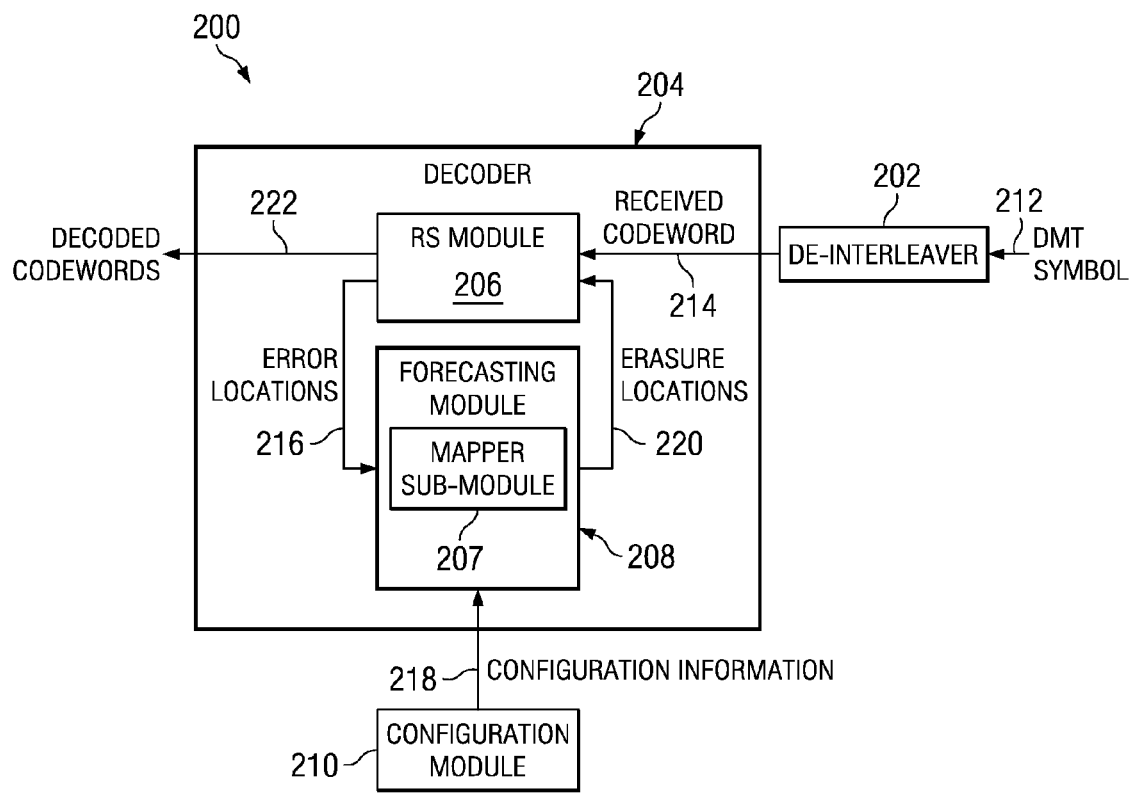
FIG. 2 shows a conceptual block diagram of the implementation of the technique disclosed herein, in accordance with preferred embodiments.

FIG. 2 shows a conceptual block diagram 200 of various functions performed by the processing logic 110 when executing the software code 108. The blocks of the block diagram 200 preferably represent actions performed by the processing logic 110 as a result of executing the software code 108. Thus, when a block of the block diagram 200 is referred to herein as performing an action, it is actually the processing logic 110 which is performing that action. However, in some embodiments, one or more blocks of the block diagram 200 may represent circuit logic (i.e., hardware). As shown, the diagram 200 comprises a de-interleaver 202 and a decoder module 204. The decoder module 204 comprises a Reed-Solomon (RS) Decoder with Erasure Decoding Module (hereinafter "RS module") 206 and an Erasure Forecasting Module (hereinafter "forecasting module") 208. The diagram 200 also comprises an Erasure Configuration/ Protection Module (hereinafter "configuration module") 210.

The de-interleaver 202 receives signals from the network 102 (FIG. 1), as indicated by numeral 212. In DSL-based systems, such signals may comprise one or more Discrete Multi-Tone (DMT) symbols (or "frames"). The de-interleaver 202 recovers a signal that was interleaved by the circuit logic which transmitted the signal. Interleaving is a standard digital signal processing (DSP) function used in many communications systems. Interleaving improves the efficiency of forward error correction functions such as Reed-Solomon encoders/decoders by spreading burst errors across several Reed-Solomon codewords. The de-interleaver performs the reverse operation of the interleaver. The de-interleaver 202 de-interleaves received DMT symbols and produces received codewords, as indicated by numeral 214. Each DMT symbol may be associated with multiple codewords. Any suitable de-interleaving algorithm or technique may be used.

The codewords produced by the de-interleaver 202 may contain both random errors as well as erasure errors. Random errors may be defined as any error whose location (e.g., in a codeword) and whose magnitude are unknown. Erasure errors may be defined as any error whose location (e.g., in a codeword) is known, but whose magnitude is unknown. The RS module 206 receives the codewords produced by the de-interleaver 202 and applies any suitable random error correction technique, such as the Reed-Solomon error correction technique, to correct random errors present in the codewords. In preferred embodiments, the RS module 206 uses parity bytes, received with the codewords, to perform correction of the random errors in the codewords. However, the errors beyond the random error correction capability of the RS module 206 may still remain whether they are random errors or erasure errors.

Accordingly, after removing some or all of the random errors from the codewords, the RS module 206 provides data indicating the locations of the random errors to the forecasting module 208 (indicated by numeral 216). In turn, the forecasting module 208 uses the error location information to determine the DMT symbol with which the error location was associated. In general, this determination is performed by a Byte-to-Symbol Mapper Sub-module (hereinafter "mapper sub-module") 207 in the forecasting module 208. In preferred embodiments, the mapper sub-module 207 determines which DMT symbol corresponds to the error location using the formula $$\text{symbol\_index} = \text{floor}((N*i+k*d)/F),$$

where "floor( )" indicates a floor function (e.g., a function which returns the largest integer less than or equal to its argument), "N" is the number of bytes per codeword, "d" is the interleaver depth, "F" is the number of bits per symbol divided by 8, "i" is the codeword index, and "k" is the byte index inside the codeword. The mapper sub-module 207 receives the parameters during a modem training phase. If the forecasting module 208 detects an impulse noise signal (as described below) in the DMT symbol determined to correspond to the location of the error detected by the RS module 206, the entire DMT symbol is assumed to be corrupt. As a result, the forecasting module 208 determines that any codeword which is associated with that DMT symbol and which follows the current codeword being error-corrected by RS module 206 contains erasure errors.

The forecasting module 208 detects impulse noise signals by determining and monitoring an E/C ratio, where "C" is the number of decoded bytes from a single DMT symbol and "E" is the actual number of errors detected on the symbol. Both E and C counters for each symbol will be updated every time the RS decoder finishes decoding a codeword. The forecasting module 208 compares the E/C ratio to a threshold. The forecasting module 208 determines an impulse noise signal to be present when the E/C ratio exceeds the threshold. In some embodiments, the forecasting module 208 determines an impulse noise signal to be present when the E/C ratio meets or exceeds the threshold. The forecasting module 208 preferably forecasts a predetermined, maximum number of erasure errors (max_erasure). The predetermined, maximum number of erasure errors and the threshold used to determine the presence of an impulse noise signal both are determined and provided to the forecasting module 208 by the configuration module 210 (indicated by numeral 218). The configuration module 210 is used to properly configure the control parameters. Without proper configuration of these parameters, the error correction performance of the decoder 204 degrades with the mixture of random errors and erasure errors in the codewords. Additionally, without proper configuration of the parameters, proper margin will not be guaranteed. "Margin" may be defined as the extra signal-to-noise ratio (SNR) reserved in a communication system such that the bit error rate (BER) will be the same even under higher noise level.

Accordingly, to determine the parameters, the configuration module 210 partitions R, which is the number of parity check bytes received in a unit (e.g., codeword) of data, into multiple portions:

$$R = R'' + T$$

where "T" is the maximum number of bytes used for erasure error correction/decoding and "R''" is the minimum margin and is used for random error correction/decoding. "R" may be determined by rate adaptation (i.e., a process to determine framing parameters) with Impulse Noise Protection (INP)=0 and a desired target margin. In some embodiments, INP may be associated with the length of impulse noise that can appear in the transmission line without causing bit error, although in other embodiments, the definition may differ. Performance degradation caused by mis-prediction (i.e., inaccurate determination regarding the location of erasure errors) is confined preferably by setting max_erasure to T. Further, the chance of mis-predicting is mitigated by setting the E/C ratio threshold (described above) to a substantially high value. This is because, when a random error is present, the E/C ratio is lower than when an impulse event is present. Thus, by setting the E/C ratio threshold to a substantially high level (e.g., greater than 90%), mis-predictions are avoided.

The configuration module 210 configures the forecasting module 208 for optimal, or near-optimal, accuracy. The configuration module 210 also maintains margin by reserving R" in parity bytes R and prevents, or at least deters, system degradation in case the forecasting module 208 erroneously determines (i.e., mis-predicts) the locations of erasure errors. To achieve these goals, multiple algorithms may be used by the configuration module 210 to configure the forecasting module 208. In particular, the configuration module 210 maximizes INP protection and data rate while mitigating performance degradation with the co-existence of impulse and random errors in received codewords.

A first, illustrative algorithm is now described. The net data rate (NDR) of a communications system, such as a DSL system, may be determined based on a minimum INP requirement and a maximum delay allowed between a transmitter and receiver. Given a target INP of $INP_T$, the rate adaptation process sets INP=$INP_T$ and generates an RS code rate defined by K, which is the number of information bytes per codeword, and by R, which is the number of parity bytes per codeword. The code rate may be defined as K/(K+R).

To determine the number of parity bytes R to reserve for random error correction, an INP level of 0 is put through the rate adaptation process and an RS code rate, defined by K' and R', is determined accordingly. Stated otherwise, the rate adaptation process is used to determine an RS code rate when no INP is desired. As mentioned, the RS code rate is defined by R' and K', where R' parity bytes are used to protect K' bytes for random noise.

Next should be determined the number of bytes to reserve for K bytes of information per codeword. This is determined by determining R" such that $$K/(K+R")=K'/(K'+R')$$

Once R" has been determined, max_erasure is set equal to (R−R") so that there is an additional R" for random error/margin protection. Thus, this algorithm improves INP by enabling erasure decoding and protects margin by adding R" for random error/margin protection.

Figure 3:
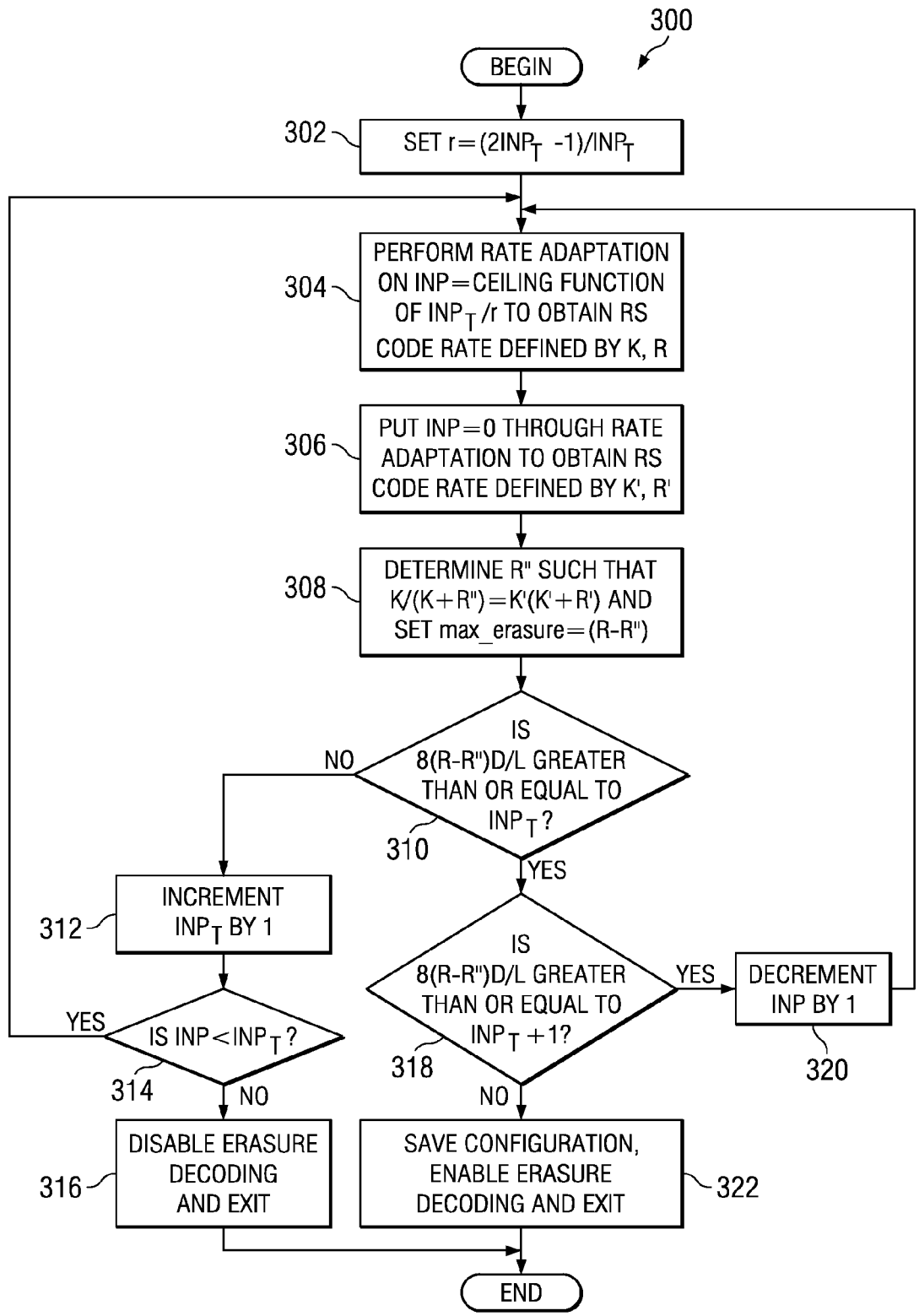
FIG. 3 shows a flow diagram of a method in accordance with various embodiments.

A second, illustrative algorithm 300 is now described in the context of FIG. 3. As described above in context of the first algorithm, effective INP may be increased by enabling erasure decoding. In the second algorithm, another way to obtain the benefits of erasure decoding is described, in which the target INP is lowered and erasure decoding is used to obtain the same effective INP as in the first algorithm. The second algorithm 300 comprises an iterative algorithm which begins by setting an initial INP improvement factor r equal to $(2INP_T-1)/INP_T$ (block 302). This equation is the initial estimation of the improvement of enabling erasure decoding. Any non-zero value may be used for this initial iteration.

The algorithm 300 then comprises setting INP equal to a ceiling function of $INP_T/r$ through rate adaptation to get an RS code rate defined by K and R (block 304). Stated otherwise, the target $INP_T$ is lowered by a factor of r. The algorithm 300 then comprises setting INP to 0 through rate adaptation and obtaining an RS code rate (i.e., without any INP requirement) (block 306). This RS code rate is defined by K' and R'. In this way, it is determined how many parity bytes should be reserved for random error/margin.

The algorithm 300 then comprises determining R" such that $$K/(K+R")=K'/(K'+R')$$

and setting max_erasure=(R−R") (block 308). The algorithm 300 then comprises determining whether 8(R−R")D/L is greater than or equal to $INP_T$, where D is the interleaver depth of the DMT symbols and L is the number of bits per DMT symbol (block 310). If so, the algorithm comprises determining whether INP is more than necessary (block 318). Stated otherwise, the algorithm 300 comprises determining whether 8(R−R")D/L is greater than or equal to $INP_T+1$. If so, INP is decremented by 1 (block 320), and control of the algorithm is passed to block 304. Otherwise, the INP level is at a desired level, and so the configuration is saved and erasure decoding is enabled (block 322).

However, if at block 310 it is determined that 8(R−R")D/L is not greater than or equal to $INP_T$, it may be the case that the INP level may not be sufficiently high to ensure adequate impulse noise protection. Accordingly, the algorithm 300 comprises incrementing $INP_T$ by 1 (block 312) and determining whether INP<$INP_T$ (block 314). If so, control of the algorithm 300 is provided to block 304. Otherwise, erasure decoding is disabled (block 316) because the INP required while enabling erasure decoding is greater than the INP required without erasure decoding.

Referring again to FIG. 2, after determining the erasure locations, the forecasting module 208 provides the erasure locations to the RS module 206, as indicated by numeral 220. The RS module 206 uses the erasure locations to correct erasure errors of subsequent codewords received from the de-interleaver 202. As previously mentioned, the RS module 206 corrects both random and erasure errors in received codewords. As indicated by numeral 222, the RS module 206 then forwards the decoded, error-corrected codewords to another module or circuit logic, as desired.

Figure 4:
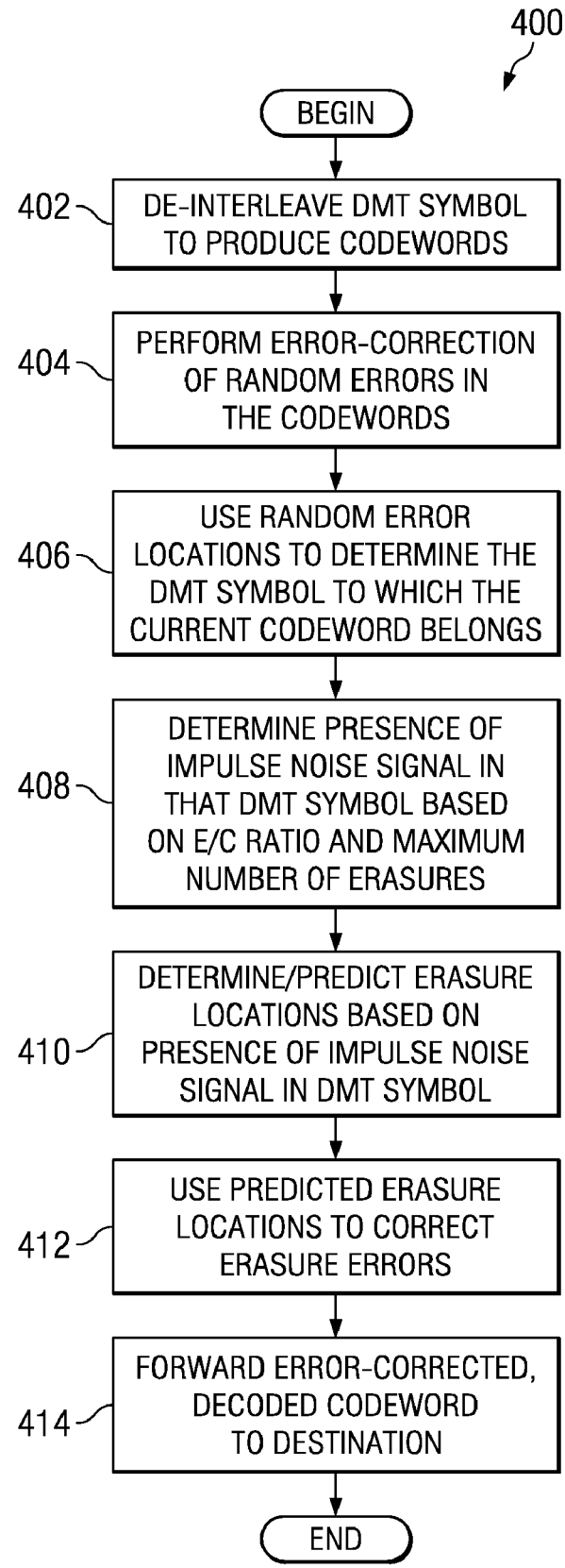
FIG. 4 shows a flow diagram of another method in accordance with various embodiments.

FIG. 4 shows a flow diagram of a method 400 implemented in accordance with various embodiments. The method 400 begins by de-interleaving a DMT symbol to produce codewords (block 402). As previously explained, these codewords comprise both random errors and erasure errors. The method 400 continues by performing error-correction of the random errors in the codewords (block 404). The random error-correction may be performed using any suitable technique, such as the Reed-Solomon technique. The method 400 then comprises using the random error locations to determine the DMT symbol to which the current codeword belongs (block 406). The method 400 comprises determining the presence of impulse noise signals in that DMT symbol, using the E/C ratio and/or the maximum number of erasures (block 408). The method 400 further comprises determining/predicting erasure error locations based on the presence of impulse noise signals in the DMT symbol identified in block 406 (block 410). The method 400 further comprises using the erasure locations predicted in block 410 to correct erasure errors (block 412). The method 400 then comprises forwarding the error-corrected, decoded codeword to a desired destination software module or circuit logic (block 414). The steps of method 400 may be performed in any suitable order.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A receiver system, comprising:
    communication logic incorporated in the receiver capable of receiving data signals from a network, at least some of said data signals comprising both erasure error and random error; and
    processing logic coupled to the communication logic incorporated in the receiver and adapted to partition parity check bytes of the received signals into a first portion and a second portion, wherein the processing logic uses the first portion for random error correction and the second portion for erasure error correction and wherein the processing logic determines the second portion by determining a difference between the first portion and a number of said parity check bytes.

2. The system of claim 1, wherein the system comprises a digital subscriber line (DSL) modem.

3. The system of claim 1, wherein the processing logic is adapted to determine said first portion by determining a Reed-Solomon code rate for random noise in the codeword.

4. The system of claim 1, wherein the communication logic is capable of wirelessly receiving said data signals from the network.

5. The system of claim 1, wherein the processing logic provides impulse noise protection using said second portion.

6. A method, comprising:
receiving a codeword in a receiver;
determining a number of parity check bytes in the received codeword, said codeword comprising both random errors and erasure errors;
partitioning said number into a first portion and a second portion;
determining said first portion by determining a code rate for random noise in said codeword;
determining said second portion by determining a difference between the first portion and a number of parity check bytes;
performing random error protection in accordance with said first portion; performing erasure error correction in accordance with said second portion; and
forwarding the error-corrected codeword to a destination.

7. The method of claim 6 further comprising providing impulse noise protection in accordance with said second portion.

8. The method of claim 6, wherein determining said code rate comprises determining a code rate for random noise only.

9. The method of claim 6, wherein determining said code rate comprises determining a Reed-Solomon code rate.

10. The method of claim 6 further comprising receiving said codeword using Digital Subscriber Line (DSL) techniques.

11. The method of claim 6 further comprising wirelessly receiving said codeword.

12. The method of claim 6 further comprising:
setting a target impulse noise protection (INP) level;
enabling erasure error correction of erasure errors in said codeword; and
as a result of enabling erasure error correction, reducing the target INP level.

13. A non-transitory computer-readable medium comprising software code which, when executed by a processor, causes the processor to:
determine a number of parity check bytes in a received codeword, said codeword comprising random errors and erasure errors;
partition said number into a first portion and a second portion;
determine said first portion by determining a code rate for random noise in said codeword;
determine said second portion by determining a difference between the first portion and a number of parity check bytes;
perform random error correction based on said first portion; and
perform erasure error correction based on said second portion.

14. The non-transitory computer-readable medium of claim 13, wherein the processor provides impulse noise protection using said second portion.

15. The non-transitory computer-readable medium of claim 13, wherein the processor determines said code rate for random noise only.

16. The non-transitory computer-readable medium of claim 13, wherein said code rate comprises a Reed-Solomon code rate.

17. The non-transitory computer-readable medium of claim 13, wherein the processor receives the codeword using Digital Subscriber Line (DSL) techniques.

18. The non-transitory computer-readable medium of claim 13, wherein the processor wirelessly receives said codeword.

19. The non-transitory computer-readable medium of claim 13, wherein the processor:
sets a target impulse noise protection (INP) level;
enables erasure error correction of erasure errors in said codeword; and
as a result of enabling erasure error correction, reduces the target INP level.

* * * * *